United States Patent [19]

Ishido

[11] Patent Number: 5,458,907
[45] Date of Patent: Oct. 17, 1995

[54] METHOD OF MANUFACTURING PRINTED CIRCUIT BOARDS HAVING AN OXIDATION PROOF COATING ON A COPPER OR COPPER ALLOY CIRCUIT PATTERN

[75] Inventor: Kiminori Ishido, Tokyo, Japan

[73] Assignee: NEC Corporation, Japan

[21] Appl. No.: 192,670

[22] Filed: Feb. 7, 1994

[30] Foreign Application Priority Data

Feb. 12, 1993 [JP] Japan .................................. 5-023830

[51] Int. Cl.[6] ...................................................... B05D 5/12
[52] U.S. Cl. .............................. 427/96; 427/304; 427/305
[58] Field of Search ............................... 427/96, 304, 305

[56] References Cited

FOREIGN PATENT DOCUMENTS

| 3-66496 | 3/1991 | Japan . |
| 4-65184 | 3/1992 | Japan . |
| 4-314383 | 11/1992 | Japan . |

OTHER PUBLICATIONS

"Printed Circuit Technique Handbook" Feb., 1987, pp. 818–825.
"The formation of a compact polymer film on a copper electrode from benzimidazole solution" 1989, pp. 163–173 (no month date).
The Condensed Chemical Dictionary, 10th Edition, Revised by G. G. Hawley, Van Nostrand Reinhold Company, 1981, p. 431.

*Primary Examiner*—Shrive P. Beck
*Assistant Examiner*—Katherine A. Bareford
*Attorney, Agent, or Firm*—Laff, Whitesel, Conte & Saret, Ltd.

[57] ABSTRACT

A method of manufacturing a printed wiring board includes the following steps. A circuit pattern consisting of one material selected from the group consisting of copper and a copper alloy is selectively formed on an insulating substrate, and a solder resist is then formed on the insulating substrate except for a region in which the circuit pattern is formed. A copper oxide and a copper impurity produced on surfaces of the solder resist and the circuit pattern formed on the insulating substrate are removed. A copper oxide coating is uniformly formed on the surface of the circuit pattern from which the copper oxide and copper impurity are removed. A oxidation-proof coating consisting of an imidazole-based pre-flux is formed by substituting the copper oxide coating on the surface of the circuit pattern with imidazole.

8 Claims, 2 Drawing Sheets

METHOD OF MANUFACTURING PRINTED CIRCUIT BOARDS HAVING AN OXIDATION PROOF COATING ON A COPPER OR COPPER ALLOY CIRCUIT PATTERN

BACKGROUND OF THE INVENTION

The present invention relates to a method of manufacturing a printed wiring board and, more particularly, to a method of manufacturing a printed wiring board having an oxidation-proof coating consisting of an imidazole-based pre-flux and formed on a circuit pattern consisting of copper or a copper alloy.

In general, a pre-flux for a printed wiring board is a flux applied in the process of manufacturing a printed wiring board, and the purpose of the pre-flux is to prevent oxidation on a circuit pattern surface consisting of copper or a copper alloy formed on the printed wiring board and protect this surface so as to prevent degradation of soldering properties until the printed wiring board is used. In order to achieve this purpose, the pre-flux requires the following properties. That is, adhesion properties to copper or a copper alloy constituting the circuit pattern must be excellent, and degradation and a change of properties are not caused by air, water, or gases, and the flux contains no halides or the like not to corrode copper or a copper alloy. In addition, the pre-flux forms a coating having good insulating properties, and the pre-flux has excellent compatibility with a post-flux to obtain excellent solder wetting properties during a soldering operation.

In an oxidation protection treatment performed by an imidazole-based pre-flux used as a conventional pre-flux having the above properties, as shown in FIG. 2A, a part mounting pad 2 consisting of copper or a copper alloy is formed at a predetermined position of an insulating substrate 1, and a solder resist 3 is applied to the insulating substrate 1.

In order to remove a copper oxide film formed on the circuit pattern surface consisting of copper and a copper alloy and including the part mounting pad 2, the resultant structure is dipped in an $H_2O_2$—$H_2SO_4$ solution mixture (35% $H_2O_2$: 25 ml/l, conc$H_2SO_4$:200 g/l) at 25° C. for 30 seconds, washed with distilled water, and then dried at 130° C. for 30 seconds.

As shown in FIG. 2B, at 40° C. for 60 to 120 seconds, the resultant structure is dipped in an aqueous formic acid solution which has a pH of 1.0 to 4.0 and in which 0.2 to 2.0 wt % of imidazole and copper ions having a concentration of 200 to 1,000 ppm are dissolved, and the resultant structure is washed with distilled water and dried at 130° C. for 30 seconds. In this manner, an imidazole-based pre-flux 5 is formed on the circuit pattern consisting of copper and a copper alloy and including the part mounting pad 2. This method is popularly known. As described in Printed Circuit Technique Handbook, pp. 818 to 825, Feb. 1987, the imidazole-based pre-flux 5 chemically reacts with copper to form a complex and to serve as an oxidation-proof coating.

In this conventional oxidation-proof treatment method using the imidazole-based pre-flux, an acid treatment is generally performed as a pre-treatment step to remove copper oxide formed on the circuit pattern surface consisting of copper or a copper alloy. In this case, although the copper oxide on the circuit pattern surface consisting of copper or a copper alloy is temporarily, completely removed by this acid treatment, nonuniform copper oxide is produced again by oxidation in water during washing with water in the sequential step or spontaneous oxidation in an drying step, and a copper impurity is present. Therefore, a uniform oxidation-proof coating consisting of an imidazole-based pre-flux can not be obtained.

SUMMARY OF THE INVENTION

It is an object of the present invention to provide a method of manufacturing a printed wiring board capable of obtaining a uniform oxidation-proof coating consisting of an imidazole-based pre-flux.

In order to achieve the above object, according to the present invention, there is provided a method of manufacturing a printed wiring board comprising the steps of selectively forming a circuit pattern consisting of one material selected from the group consisting of copper and a copper alloy on an insulating substrate, and then forming a solder resist on the insulating substrate except for a region in which the circuit pattern is formed, removing copper oxide and a copper impurity produced on surfaces of the solder resist and the circuit pattern formed on the insulating substrate, uniformly forming a copper oxide coating on the surface of the circuit pattern from which the copper oxide and copper impurity are removed, and forming an oxidation-proof coating consisting of an imidazole-based pre-flux by substituting the copper oxide coating on the surface of the circuit pattern with imidazole.

DESCRIPTION OF THE PREFERRED EMBODIMENTS

Embodiments of the present invention will be described below with reference to the accompanying drawings.

Figure 1A:
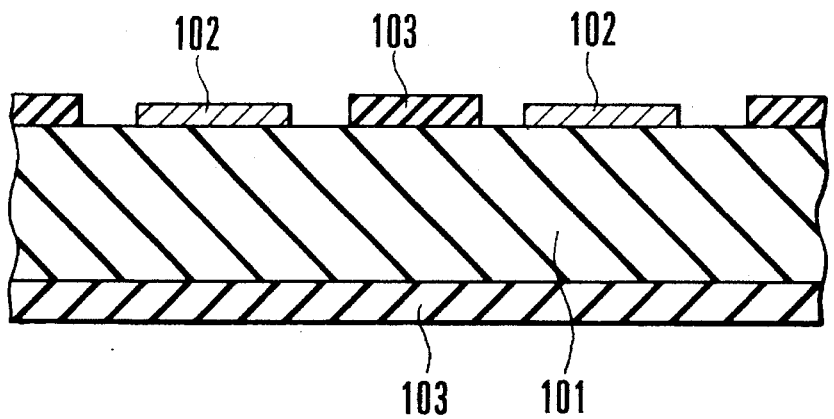
FIGS. 1A, 1B, and 1C are sectional views sequentially showing the steps for explaining a method of manufacturing a printed wiring board according to the first and second embodiments of the present invention.
Figure 1B:
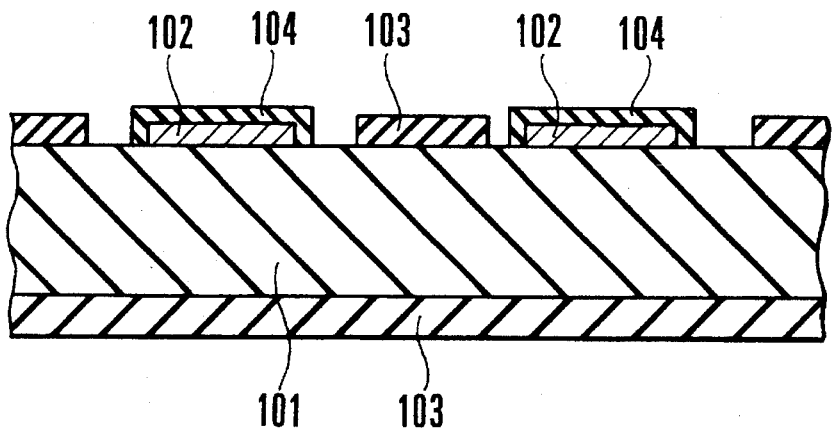
Figure 1C:
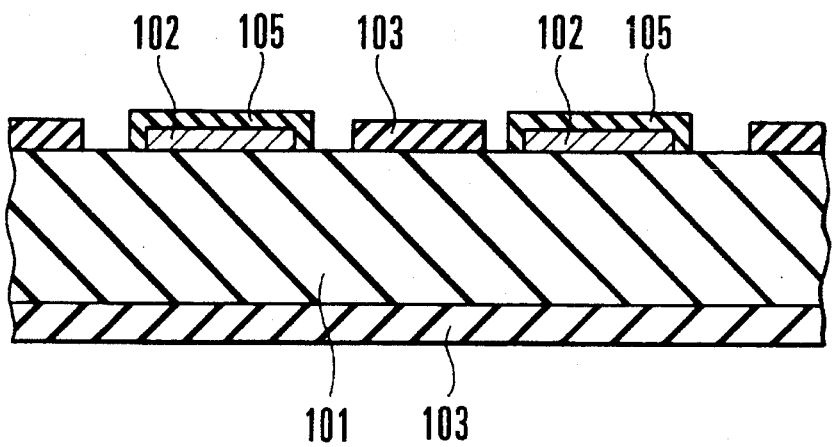
Figure 2A:
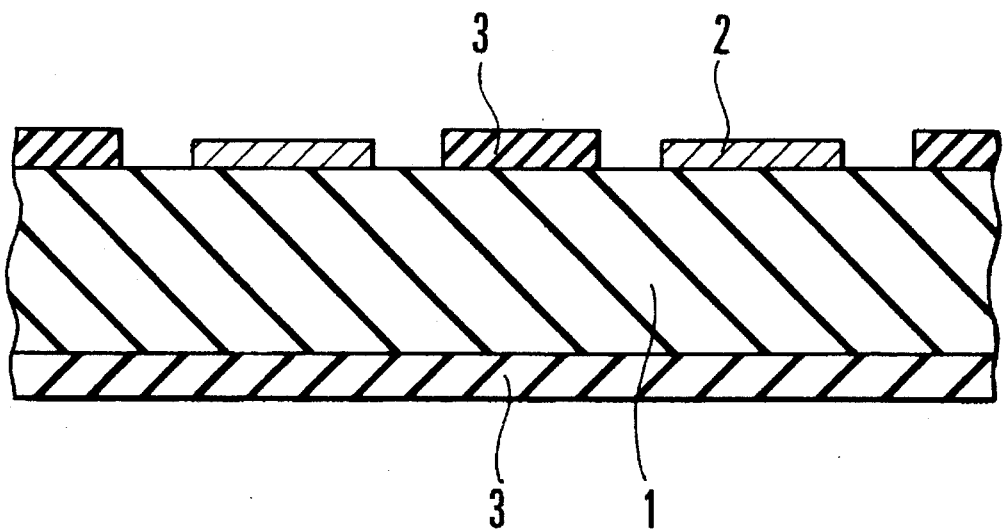
FIGS. 2A and 2B are sectional views sequentially showing the steps for explaining a method of manufacturing a conventional printed wiring board.
Figure 2B:
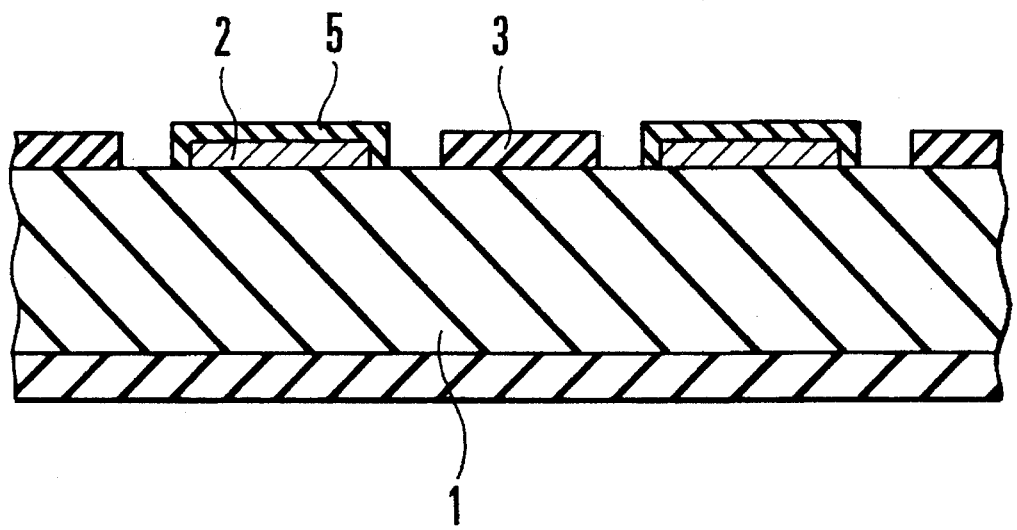

FIGS. 1A to 1C sequentially show the steps for explaining the first and second embodiments of the present invention. According to the first embodiment, as shown in FIG. 1A, each part mounting pad 102 consisting of copper or a copper alloy is formed at a predetermined position of an insulating substrate 101, and a solder resist 103 is applied to the insulating substrate 101 except for the region in which the part mounting pads 102 are formed.

In order to remove copper oxide formed on a circuit pattern surface consisting of copper or a copper alloy and including the part mounting pad 102, the resultant structure is dipped in an $H_2O_2$—$H_2SO_4$ solution mixture (35% $H_2O_2$: 25 ml/l, conc$H_2SO_4$: 200 g/l) at 25° C. for 30 seconds, washed with distilled water, and then dried at 130° C. for 30 seconds.

In order to remove copper oxide and a copper impurity produced on the circuit pattern surface consisting of copper or a copper alloy and including the part mounting pads 102, the resultant structure is dipped in an aqueous sulfuric acid solution (pH of 4 to 6) containing 0.05 to 1 mol/l of ethylenediaminetetraacetic acid (to be referred to as EDTA hereinafter) at room temperature for 30 to 60 seconds, washed with distilled water, and then dried.

As shown in FIG. 1B, baking is performed at 130° C. for 10 minutes to uniformly form a copper oxide coatings 104 each having a thickness of 100 to 1,000 Å on the circuit pattern surface which consists of copper or a copper alloy and includes the part mounting pads 102 and from which the copper oxide and copper impurity are removed.

As shown in FIG. 1C, at 40° C. for 60 to 120 seconds, the resultant structure is dipped in an aqueous formic acid solution which has a pH of 1.0 to 4.0 and in which 0.2 to 2.0 wt % of imidazole and copper ions having a concentration of 200 to 1,000 ppm are dissolved. The resultant structure is washed with distilled water and dried at 130° C. for 30 seconds. In this manner, an imidazole-based pre-flux 105 having a thickness of 36 μm and a variability of $3\sqrt{V} =0.04$ μm is formed as an oxidation-proof coating on the circuit pattern surface consisting of copper or a copper alloy and including the part mounting pads 102.

A mechanism of forming the oxidation-proof coating by the imidazole-based pre-flux 105 is defined by the chemical reaction formula to be described below. That is, imidazole is substituted with the copper oxide coating 104 formed on the circuit pattern surface consisting of copper or a copper alloy and including the part mounting pads 102, and an oxidation-proof coating constituted by water and the imidazole-based pre-flux 105 is formed as a copper complex. Therefore, when the uniform copper oxide coating 104 is formed on the circuit pattern surface consisting of copper or a copper alloy and including the part mounting pads 102 is formed immediately before a treatment with the imidazole-based pre-flux 105 is performed, a uniform oxidation-proof coating can be obtained by the following reaction.

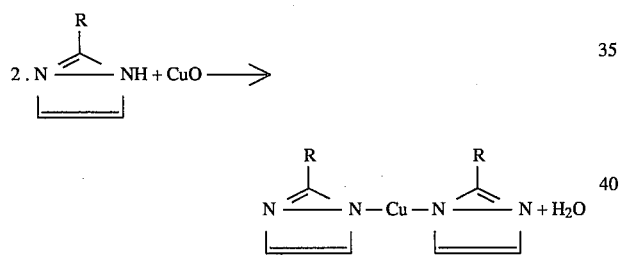

The second embodiment is different from the first embodiment in the step of forming a copper oxide coating. According to the second embodiment, as shown in FIG. 1A, each part mounting pad 102 consisting of copper or a copper alloy is formed at a predetermined position of an insulating substrate 101, A solder resist 103 is applied to the insulating substrate 101. In order to remove copper oxide formed on a circuit pattern surface consisting of copper or a copper alloy and including the part mounting pads 102.

The resultant structure is dipped in an $H_2O_2$—$H_2SO_4$ solution mixture (35% $H_2O_2$: 25 ml/l, conc$H_2SO_4$: 200 g/l) at 25° C. for 30 seconds, washed with distilled water, and then dried at 130° C. for 30 seconds. In order to remove copper oxide and a copper impurity produced on the circuit pattern surface consisting of copper or a copper alloy and including the part mounting pads 102, the resultant structure is dipped in an aqueous sulfuric acid solution (pH of 4 to 6) containing 0.05 to 1 mol/l of EDTA at room temperature for 30 to 60 seconds, washed with distilled water, and then dried.

As shown in FIG. 1B, the resultant structure is dipped in 2 to 5%, by weight of an aqueous $H_2O_2$ solution at room temperature for 20 to 60 seconds, washed with distilled water, and dried at 130° C. for 30 seconds. In this manner, as in the first embodiment, copper oxide coatings 104 each having a thickness of 100 to 1,000 Å are uniformly formed on the circuit pattern which consists of copper or a copper alloy and includes the part mounting pads 102 and from which the copper oxide and copper impurity are removed.

As shown in FIG. 1C, at 40° C. for 60 to 120 seconds, the resultant structure is dipped in an aqueous formic acid solution which has a pH of 1.0 to 4.0 and in which 0.2 to 2.0 wt % of imidazole and copper ions having a concentration of 200 to 1,000 ppm are dissolved. The resultant structure is washed with distilled water and dried at 130° C. for 30 seconds. In this manner, as in the first embodiment, an imidazole-based pre-flux 105 having a thickness of 36 μm and a variability of $3\sqrt{V}=0.04$ μm is formed as an oxidation-proof coating on the circuit pattern surface consisting of copper or a copper alloy and including the part mounting pads 102.

As described above, according to the present invention, a uniform copper oxide film is formed in advance on a circuit pattern consisting of copper or a copper alloy, and an imidazole film is formed by a substitution reaction. For this reason, a uniform oxidation-proof coating consisting of an imidazole-based pre-flux can be advantageously formed.

In a conventional method of forming a rustproof coating consisting of an imidazole-based pre-flux, although the average thickness of the oxidation-proof coating is 0.36 μm, a value of $3\sqrt{V}$ has a variability of 0.12 μm. In the method of forming a oxidation-proof coating consisting of an imidazole-based pre-flux according to the present invention, the value of $3\sqrt{V}$ is reduced to 0.04 μm.

What is claimed is:

1. A method of manufacturing a printed wiring board comprising the steps of:

forming a circuit pattern consisting of one material selected from the group consisting of copper and a copper alloy on an insulating substrate, and then forming a solder resist on said insulating substrate except for a region in which said circuit pattern is formed;

removing copper oxide and impurities on surfaces of said solder resist and said circuit pattern formed on said insulating substrate, the step of removing copper oxide and copper impurity further comprising the step of acid processing said insulating substrate on which said circuit pattern and solder resist are formed, and the step of treating said acid-processed insulating substrate with ethylenediaminetetraacetic acid;

forming a uniform copper oxide coating on the surface of said circuit pattern from which the copper oxide and impurities are removed, said copper oxide coating uniformly formed on the surface of said circuit .pattern having a thickness in the range of about 100 to 1,000 Å, the step of forming a copper oxide coating further comprising the step of baking said insulating substrate, in which copper oxide and impurities are removed from the surface of said circuit pattern, at about 130° C. for about 10 minutes; and forming an oxidation-proof coating consisting of an imidazole-based pre-flux by reacting said copper oxide coating on the surface of said circuit pattern with imidazole.

2. A method according to claim 1, wherein said copper oxide coating uniformly formed on the surface of said circuit pattern has a thickness of 100 to 1,000 Å.

3. A method according to claim 1, wherein the step of forming a oxidation-proof coating comprises the step of dipping, at 40° C. for 60 to 120 seconds, said insulating substrate, in which said copper oxide coating is uniformly formed on the surface of said circuit pattern, in an aqueous formic acid solution which has a pH of 1.0 to 4.0 and in which 0.2 to 2.0 wt % of imidazole and copper ions having a concentration of 200 to 1,000 ppm are dissolved.

4. A method according to claim 1 wherein said step of treating said insulating substrate with ethylenediaminetetraacetic acid is followed by the further steps of washing said circuit pattern with distilled water and then drying said circuit pattern.

5. A method of manufacturing a printed wiring board comprising the steps of:

forming a circuit pattern consisting of one material selected from the group consisting of copper and a copper alloy on an insulating substrate, and then forming a solder resist on said insulating substrate except for a region in which said circuit pattern is formed;

removing copper oxide and impurities produced on surfaces of said solder resist and said circuit pattern formed on said insulating substrate, the step of removing copper oxide and impurities further comprising the step of acid treating said insulating substrate on which said circuit pattern and solder resist are formed and the step of treating said acid-processed insulating substrate with ethylenediaminetetraacetic acid;

forming a uniform copper oxide coating having a thickness in a range of about 100 to 1,000 Å on the surface of said circuit pattern from which the copper oxide and impurities are removed; the step of forming said copper oxide coating further comprising the steps of dipping said insulating substrate, on which copper oxide and impurities are removed from the surface of said circuit pattern, into a 2 to 5% by weight, solution of aqueous $H_2O_2$ at room temperature for about 20 to 60 seconds, washing said insulating substrate with distilled water, and drying said insulating substrate at 130° C. for about 30 seconds; and forming an oxidation-proof coating consisting of an imidazole-based pre-flux by reacting said copper oxide coating on the surface of said circuit pattern with imidazole.

6. A method according to claim 5, wherein said copper oxide coating uniformly formed on the surface of said circuit pattern has a thickness of 100 to 1,000 Å.

7. A method according to claim 5, wherein the step of forming an oxidation-proof coating comprises the step of dipping, at 40° C. for 60 to 120 seconds, said insulating substrate, in which said copper oxide coating is uniformly formed on the surface of said circuit pattern, in an aqueous formic acid solution which has a pH of 1.0 to 4.0 and in which 0.2 to 2.0 wt % of imidazole and copper ions having a concentration of 200 to 1,000 μm are dissolved.

8. A method according to claim 5 wherein said step of treating said insulating substrate with ethylenediaminetetraacetic acid is followed by the further steps of washing said circuit pattern with distilled water and then drying said circuit pattern.

\* \* \* \* \*